US009953909B2

(12) United States Patent
Liang et al.

(10) Patent No.: US 9,953,909 B2
(45) Date of Patent: Apr. 24, 2018

(54) BALL GRID ARRAY (BGA) WITH ANCHORING PINS

(71) Applicant: Intel Corporation, Santa Clara, CA (US)

(72) Inventors: Zuyang Liang, Portland, OR (US); Michael Garcia, Chandler, AZ (US); Joshua D. Heppner, Chandler, AZ (US); Srikant Nekkanty, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/212,951

(22) Filed: Jul. 18, 2016

(65) Prior Publication Data

US 2018/0019193 A1    Jan. 18, 2018

(51) Int. Cl.
*H01L 23/48* (2006.01)
*H01L 23/498* (2006.01)
*H01L 23/13* (2006.01)

(52) U.S. Cl.
CPC ........ *H01L 23/49816* (2013.01); *H01L 23/13* (2013.01)

(58) Field of Classification Search
CPC ....... H01L 23/49827; H01L 2225/1058; H01L 24/29; H01L 2224/83; H01L 2224/73203
USPC .................. 257/697, 693, 780, 781; 438/125
See application file for complete search history.

(56) References Cited

U.S. PATENT DOCUMENTS

| 3,871,014 | A | * | 3/1975 | King | ........................ H01L 24/12 228/180.22 |
| 5,136,366 | A | | 8/1992 | Worp et al. | |
| 5,260,601 | A | * | 11/1993 | Baudouin | ......... H01L 23/49555 174/533 |
| 6,163,028 | A | * | 12/2000 | Orava | ............... H01L 27/14603 250/370.08 |
| 6,184,062 | B1 | * | 2/2001 | Brofman | .................. H01L 24/11 257/738 |
| 6,541,305 | B2 | * | 4/2003 | Farooq | ................ H01L 21/6835 257/E21.508 |
| 6,991,960 | B2 | * | 1/2006 | Howarth | ............. H01L 23/3128 257/777 |
| 8,922,011 | B2 | * | 12/2014 | Osumi | ............. H01L 23/49811 257/693 |

(Continued)

FOREIGN PATENT DOCUMENTS

JP    2001044326 A    2/2001

OTHER PUBLICATIONS

International Search Report and Written Opinion dated Sep. 28, 2017 for International Application No. PCT/US2017/037905, 12 pages.

*Primary Examiner* — S. V. Clark
(74) *Attorney, Agent, or Firm* — Schwabe, Williamson & Wyatt, P.C.

(57) ABSTRACT

Embodiments herein may relate to an electronic device that includes a board. The electronic device may include a device physically coupled with the board by an anchoring pin. The electronic device may further include a plurality of ball grid array (BGA) solder joints coupled with the device. For example, the BGA solder joints may electrically and/or communicatively couple one or more pins of the device with the board. The BGA solder joints may have a shape that is different than the anchoring pin. Other embodiments may be described and/or claimed.

21 Claims, 10 Drawing Sheets

(56) References Cited

U.S. PATENT DOCUMENTS

2006/0043568 A1* 3/2006 Abe .................. H01L 21/4857
 257/698
2006/0065977 A1  3/2006 Bora et al.
2006/0115975 A1  6/2006 Kung et al.
2008/0315389 A1 12/2008 Nunn

* cited by examiner

BALL GRID ARRAY (BGA) WITH ANCHORING PINS

TECHNICAL FIELD

The present disclosure relates generally to the field of ball grid arrays (BGAs), and more specifically to the use of one or more anchoring pins in conjunction with a BGA.

BACKGROUND

Ball grid array (BGA) connections may include a plurality of solder joints used to physically and electrically couple a die package (sometimes referred to as a semiconductor package or a package) or a socket with a circuit board. Solder joint cracks at the corners or periphery of the BGA may be caused by shock, vibration, and/or bending. When such solder joint cracks appear, they may result in a disconnection of electrical signals or the power path between the die package or socket and the board, which may cause system failure.

Legacy die packages or sockets may be coupled with a board via non-critical-to-function (NCTF) solder joints that serve as sacrificial joints in the BGA. Specifically, these NCTF solder joints may not be electrically or communicatively coupled with an active pin of the die package (either directly or via the socket), and so may not be used to carry electrical or communicative signals. Rather, the NCTF solder joints may be placed in areas of the BGA that are more likely to experience solder joint cracks. Thus, if such cracks happen, they may occur at the NCTF solder joints rather than a solder joint of the BGA that is carrying electrical or communication signals. As a result, the disconnection of electrical signals or the power path may not occur.

However, the growing number of NCTF solder joints may result in a reduction of space for solder joints in the BGA that carry electrical or communicative signals (i.e., critical-to-function (CTF) solder joints). Additionally, as pitch size of the BGA decreases, it may be more difficult to isolate the cracks to the NCTF solder joints and so CTF solder joints may still experience a failure condition such as cracking if a NCTF solder joint does.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Embodiments herein may relate to an electronic device that includes a board. The electronic device may include a device physically coupled with the board by an anchoring pin. For example, the device may be a die package, a socket to receive the die package, or some other type of device that communicates with the board via one or more pins. The electronic device may further include a plurality of ball grid array (BGA) solder joints coupled with the device. The BGA solder joints may electrically and/or communicatively couple one or more pins of the device with the board. The BGA solder joints may have a shape and/or material composition that is different than the anchoring pin. Generally, the anchoring pins may be configured to reduce physical forces experienced by the BGA solder joints, thereby reducing cracking in the BGA solder joints. Other embodiments may be described and/or claimed.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As noted above, legacy electronic devices where a device such as a die package or socket is coupled with a substrate via BGA solder joints may use NCTF solder joints. The NCTF solder joints may however occupy space in the BGA that could otherwise be used to transmit electronic and/or communicative signals. Additionally, if a failure condition such as solder joint cracking occurs at a NCTF solder joint in the BGA, the failure condition may still propagate to CTF solder joints.

Additionally, if the die package is coupled with a socket, and the NCTF solder joints are used in a BGA to couple a socket to a board, then localized solutions may be implemented in an attempt to reduce failure conditions in the BGA. For example, the j-lead stiffness of a contact of the socket may be decreased, or the material properties or layout of the socket may be changed. However, such a change may not be scalable over successive generations of products, and particularly in server sockets with high pin counts. Further, the increasing trend in pin counts to accommodate input/output (I/O) demands related to the socket and the die package may make it challenging to incorporate these local solutions.

By contrast, embodiments herein may present a global solution that is scalable. Specifically, one or more anchoring pins may be used to couple the device to the board. The anchor pins may absorb load related to thermal forces or warpage, and thereby reduce or minimize the physical forces seen by the BGA solder joints.

Generally, embodiments herein may have the advantage of increasing solder joint reliability when the board to which the BGA solder joints are coupled is bent due to test and/or manual handling, when the board experiences shock and/or vibration, or is otherwise physically disturbed in a manner which would present a stressor on the BGA solder joints and/or the device. Embodiments herein may also reduce or eliminate the number of NCTF solder joints in the BGA, and thereby present a potential reduction in the foot print of the device. In embodiments herein, the thermal cycle solder joint reliability of BGA solder joints may also be increased based on reduction or minimization of the effect of global coefficient of thermal expansion (CTE) mismatch between the BGA solder joints and the board. In embodiments herein, the one or more anchoring pins may also minimize the internal force induced from an engaging mechanism, thus protecting solder joints in the BGA from preloading in tension. The one or more anchoring pins or the elements of the device to which the anchoring pins couple may also be integrated into a stiffener coupled with the socket, the socket itself, and/or a die package, thus there may not be significant additional cost to using the one or more anchoring pins. Finally, the anchoring pins may be coupled with the device and/or the board during the current reflow or soldering process by which the BGA solder balls are reflowed to solder joints that electrically and/or communicatively couple the device with the board via the BGA solder joints, and therefore there may not be significant increased assembly cost. In some embodiments, a device that is bonded with a board via the anchoring pins may require as much as 100 pounds (lbs) of force to remove the device from the board. By contrast, legacy devices that were bonded with the board via one or more NCTF solder joints may have only required approximately 1 lb of force to remove the device from the board.

Figure 1:
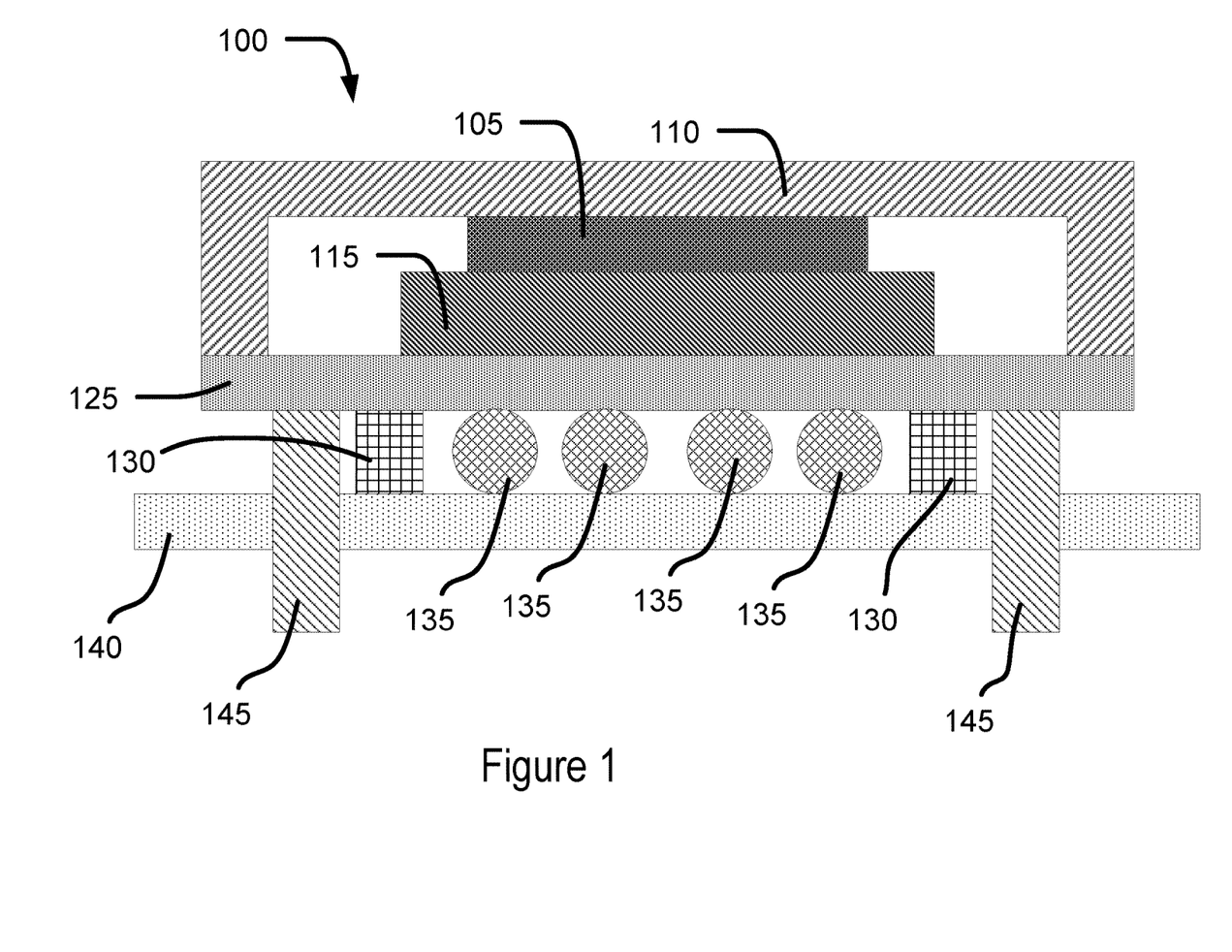
FIG. 1 depicts an example electronic device with one or more anchoring pins, in accordance with various embodiments.

FIG. 1 depicts an example electronic device 100 with one or more anchoring pins 145. Specifically, the electronic device 100 may include a die package 105 coupled with a socket 115. In embodiments, the die package 105 may be referred to as a semiconductor package or an integrated circuit (IC) package. The die package 105 may include one or more die (not shown) that may include a memory die, a processor die, and/or some other type of die. The die may be encased in one or more molding materials and electrically coupled with one or more contacts (not shown) on the portion of the die package 105 coupled with the socket 115. In embodiments, the socket 115 may include one or more j-leads, which may be flexible wires that are intended to make electrical and communicative contact with the contacts of the package 105. The j-leads are shown and discussed in greater detail below.

The electronic device 100 may include an engaging mechanism 110 that may hold the die package 105 in the socket 115. For example, the engaging mechanism 110 may wholly or partially surround the die package 105 and/or the socket 115, and apply force to the die package 105 such that the die package 105 is securely held in the socket 115 and contacts of the die package 105 are held in contact with contacts of the socket 115. In some embodiments, the engaging mechanism 110 may be hinged, compressive, or some other type of engaging mechanism.

The electronic device 100 may include a stiffener 125, which in some embodiments may be coupled with the engaging mechanism 110. However, in other embodiments (not shown) the engaging mechanism 110 may only be partially coupled with the stiffener 125, or not in physical contact with the stiffener 125. The stiffener 125 may be coupled with the socket 115 and configured to provide structural stability and/or support to the socket 115 specifically or the electronic device 100 in general. In embodiments, the stiffener 125 may be a metal, ceramic, and/or plastic element such as a plate.

The package 105 and the socket 115 may be coupled with a board 140 via a BGA array that includes one or more solder joints 135. The board 140 may be a printed circuit board, a motherboard, a substrate of some other element like a patch or interposer, or some other type of board. The solder joints 135 may be formed of a reflowed solder ball, and may include a flux, a powder, metals such as tin, lead, silver, or copper, alloys thereof, or some other solder element. As indicated above, one or more of the solder joints 135 may be CTF or NCTF solder joints.

The stiffener 125 may be offset from the board 140 by one or more standoffs 130. The standoffs 130 may be desirable because the standoffs 130 may be used to prevent the solder joints 135 from bridging during reflow. The standoffs 130 may additionally absorb compressive load on the package 105 and/or socket 115, for example as may be caused by engaging mechanism 110.

In embodiments, the stiffener may be coupled with the board 140 via one or more anchoring pins. As described above, the anchoring pins 145 may be configured to reduce physical stresses on the solder joints 135. As shown in FIG.

1, the anchoring pins 145 may have a different form factor than the solder joints 135. For example, the anchoring 145 pins may be elongated cylinders or have some other type of cross section such as a hexagonal, pentagonal, square-shaped, etc. cross section. In embodiments, the anchoring pins 145 may be made of a metal such as stainless steel or some other relatively high strength material, metal, and/or alloy with a hardness and resistance to bending above that of the solder joints 135. In some embodiments, the anchoring pins 145 may be between approximately 5 and approximately 15 millimeters (mm) long, and in some embodiments may be approximately 10 mm long. Additionally, in some embodiments the anchoring pins 145 may have a diameter between approximately 1 and approximately 3 mm, and in some embodiments the diameter may be approximately 2 mm.

Although not shown for the sake of clarity, the socket 115 and/or stiffener 125 may have one or more electrical traces, pads, or contacts. Additionally, the socket 115 and/or stiffener 125 may have one or more through mold vias (TMVs) or other type of vias (not shown for the sake of clarity). Similarly, the socket 115 and/or stiffener 125 may have one or more redistribution layers (RDLs) (not shown for the sake of clarity). Generally, the elements such as the traces, pads, contacts, vias, RDLs, etc. may be designed to carry electrical and/or communicative signals between the contacts of the package 105 and the BGA solder joints 135.

Figure 2:
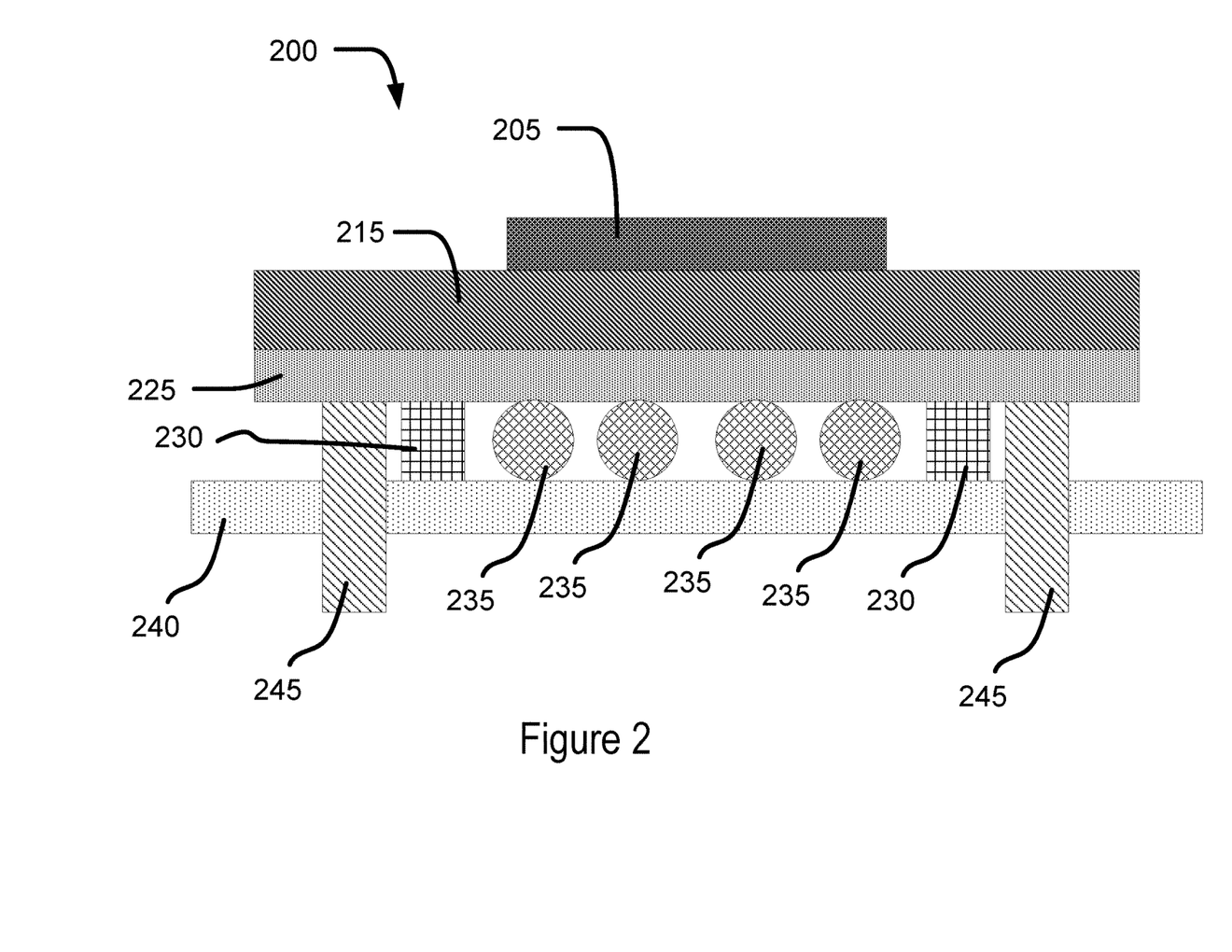
FIG. 2 depicts an alternative example electronic device with one or more anchoring pins, in accordance with various embodiments.

FIG. 2 depicts an alternative example electronic device 200 with one or more anchoring pins 245. The electronic device 200 may be similar to electronic device 100, and similar elements may be numbered similarly. For example, electronic device 200 may include a die package 205, a socket 215, a stiffener 225, one or more standoffs 230, one or more solder joints 235, a board 240, and one or more anchoring pins 245 which may be respectively similar to die package 105, socket 115, stiffener 125, one or more standoffs 130, one or more solder joints 135, board 140, and one or more anchoring pins 145. One difference between electronic device 200 and electronic device 100 may be that electronic device 200 may not include the engaging mechanism 110 depicted in FIG. 1.

Figure 3:
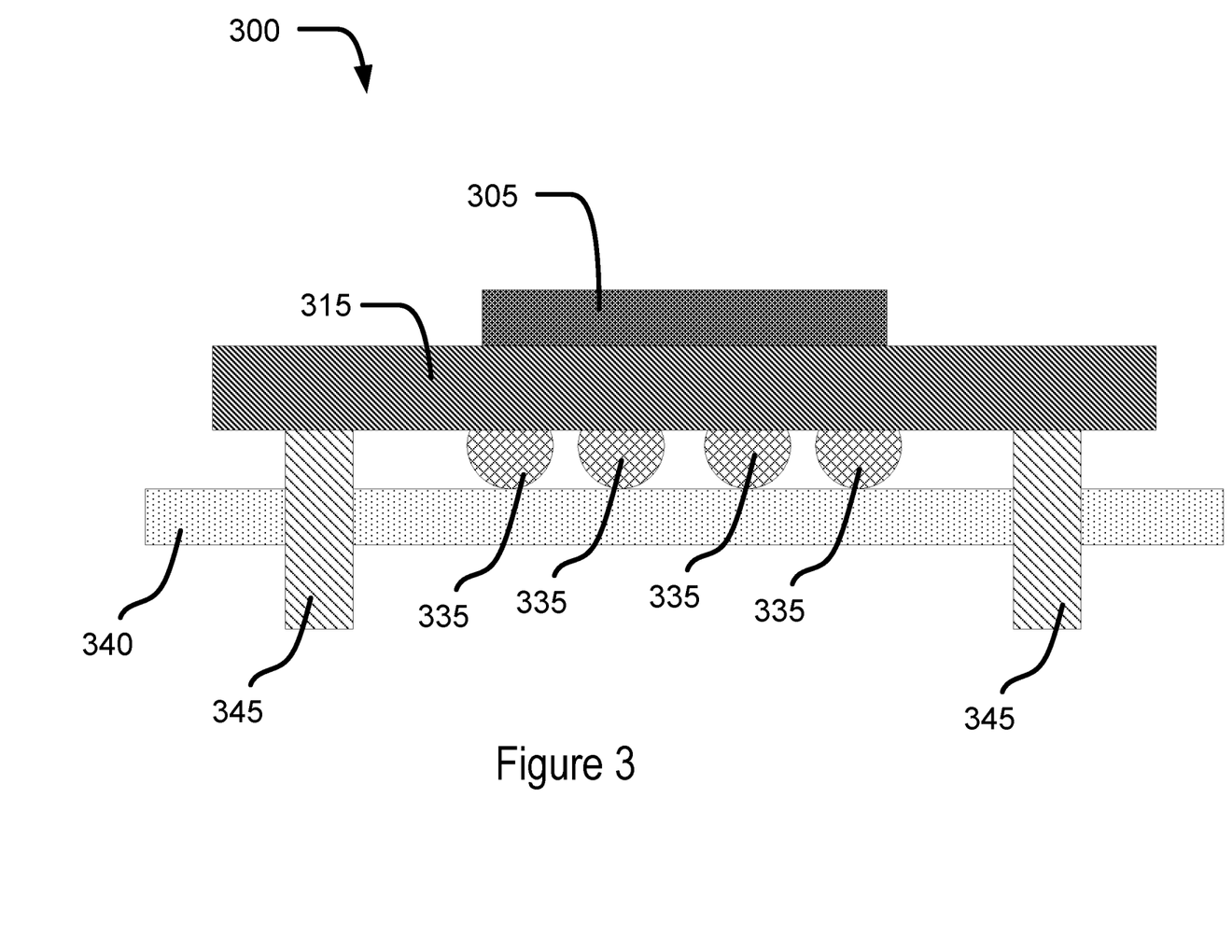
FIG. 3 depicts an alternative example electronic device with one or more anchoring pins, in accordance with various embodiments.

FIG. 3 depicts an alternative example electronic device 300 with one or more anchoring pins 345. The electronic device 300 may be similar to electronic devices 100 or 200, and similar elements may be numbered similarly. For example, electronic device 300 may include a die package 305, a socket 315, a board 340, one or more anchoring pins 345, and one or more solder joints 335, which may be respectively similar to die package 105/205, socket 115/215, board 140/240, anchoring pins 145/245, and solder joints 135/235.

As can be seen in FIG. 3, the electronic device 300 may not include standoffs such as standoffs 130. The standoffs may not be included because in some embodiments standoffs may negatively impact the formation of solderjoints such as solder joints 335. Generally, standoffs may be embodiment-specific and used based on factors such as whether an engaging mechanism may be used, the number or arrangement of solder joints 335, the desired z-height of the package, and/or additional or alternative factors. Additionally, the electronic device 300 may not include a stiffener such as stiffener 125. Rather, the anchoring pins 345 may be coupled directly with the socket 315.

It will be understood that the above described examples of FIGS. 1-3 are intended as non-limiting examples. For example, the lateral dimensions of elements such as the die package 105/205/305 and/or socket 115/215/315, or other elements, are intended as examples and other embodiments may have different lateral dimensions of the package, the socket, or some other element. Similarly, the relative z-heights of the various elements, or the number of elements such as the number of anchoring pins 145/245/345, standoffs 130/230, solder joints 135/235/335, or other elements may be different in other embodiments.

Figure 4A:
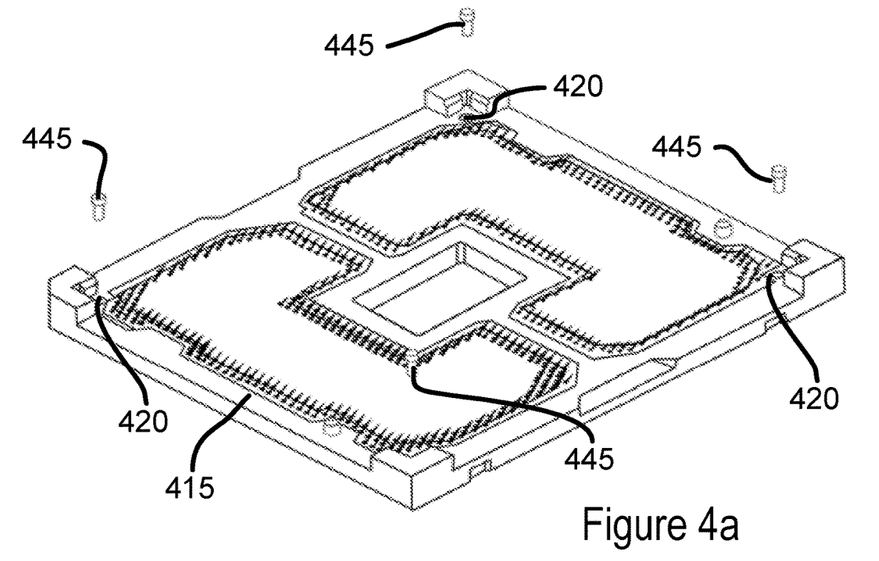
FIGS. 4a and 4b depict an example of a socket with one or more anchoring pins, in accordance with various embodiments.
Figure 4B:
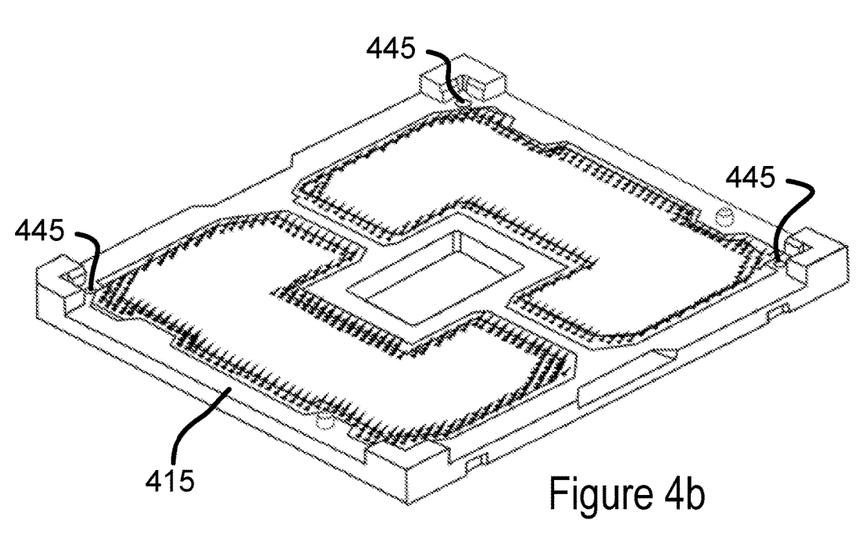

FIGS. 4a and 4b depict an example of a socket 415 with one or more anchoring pins 445. Socket 415 may be similar to sockets 115/215/315, and anchoring pins 445 may be similar to anchoring pins 145/245/345. As shown in FIGS. 4a and 4b, the anchoring pins 445 may be inserted into holes 420 in the socket 415. As shown in FIGS. 4a and 4b, the socket 415 may be configured with four holes 420 at the outer corners of the socket 415. However, in other embodiments there may be more or fewer holes 420 than shown in the Figures. In some embodiments, the holes 420 may be at internal portions of the socket 415 and/or at some other peripheral portion of the socket in addition to, or instead of, the corners as shown in FIGS. 4a and 4b. For example, the location and/or number of the anchoring pins 445 may be based on the design of the socket 415, load boundary conditions, or some other factor.

As shown in FIGS. 4a and 4b, the anchoring pins 445 may be integrated into the socket 415 via press fitting the pins 445 into the holes 420. In other embodiments, the anchoring pins 445 may be integrated into the socket 415 by positioning the anchoring pins 445 into the holes 420 and covering them with a molding material (i.e., over molding the anchoring pins 445), gluing the anchoring pins 445 to the socket 415, or some other technique. Generally, in embodiments it will be desirable to attach the anchoring pins 445 to the socket 415 in a secure manner such that the pins do not become loose when the socket 415 experiences some form of mechanical stressor such as shock, vibration, or warpage.

In various embodiments, the anchoring pins (e.g., anchoring pins 145/245/345/445) may be coupled with a board (e.g., board 140/240/340) via various coupling techniques. One such technique may include a surface mount technology (SMT) pin-in-paste technique where solder paste is placed on the board. The anchoring pin may be placed in the solder paste and a reflow process may be performed such that the solder reflows around the anchoring pin and binds the anchoring pin to the board. This reflow process may be the same reflow process by which BGA solder joints are formed, or a different reflow process.

A similar SMT technique may include a pin-in-hole technique where solder paste is placed in a hole such as hole 420, and then the anchoring pin may be placed in the hole. The anchoring pin may pull the molten solder to fill the gap in the hole on the board and form solder fillet at the other end to bond the anchoring pin on the board during the reflow process.

Another technique to couple an anchoring pin with a board may include through hole mount (THM) wave soldering. In THM wave soldering, a hole may be drilled in the board and the anchoring pin may be placed into the hole. The anchoring pin may then be secured via a soldering process on the side of the board opposite the side to which the BGA solder joints are coupled. FIGS. 1, 2, and 3 all depict an examples of a THM process where the anchoring pins 145/245/345 extend fully through the board 140/240/340. In other embodiments, the anchoring pin(s) may only extend partially into the board and may be coupled with the board via some other technique.

Another technique to couple an anchoring pin with a board may include a mechanical technique such as a force fit technique, crimping, screwing, a nut/bolt arrangement, etc. For example, the anchoring pin may be ridged along the length of the anchoring pin or at the end of the anchoring pin so that it is easy to insert into a hole in the socket and/or board, but difficult to remove. Alternatively, the anchoring pin may be screwed into the socket and/or board, or may be coupled with a nut on a side of the board opposite the side to which the BGA solder joints are attached. In some embodiments, the anchoring pin may be crimped so that it cannot be removed from the board.

In some embodiments, the anchoring pin may be coupled with a pad or trace of the board. In this embodiment, the anchoring pin may act as a signal carrier to carry signals such as ground signals between the socket and the board. In other embodiments, the anchoring pin may be coupled with an electrically or communicatively neutral portion of the board so that it doesn't carry any electrical or communicative signals between the socket and the board.

Figure 5:
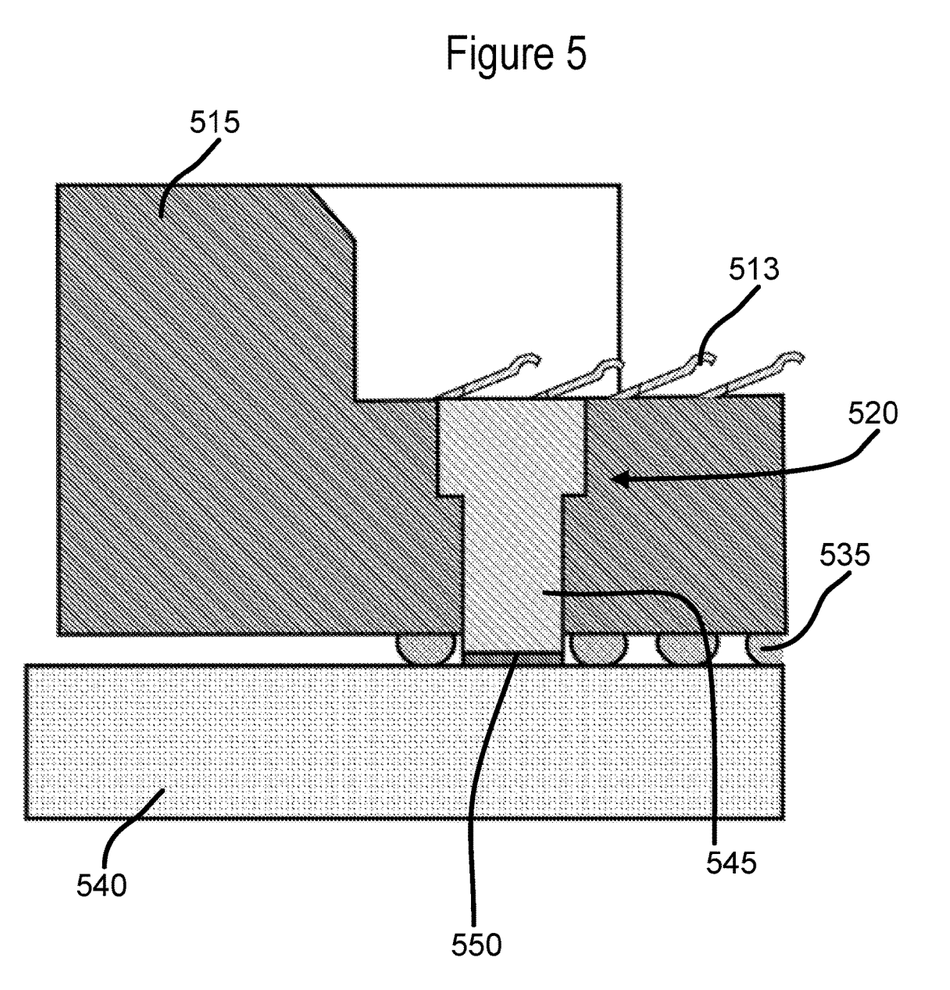
FIG. 5 depicts an example of an implementation of an anchoring pin, in accordance with various embodiments.

FIG. 5 depicts an example of an implementation of an anchoring pin 545 coupled with a board 540 via an SMT technique such as one of the SMT techniques described above. Specifically, FIG. 5 depicts a socket 515 which may be similar to socket 115 or some other socket described herein. The socket may include one or more j-leads 513, which are designed to make contact with one or more contacts on a die package such as die package 105 or some other die package herein.

The socket 515 may include a hole 520, which may be similar to hole 420. An anchoring pin 545, which may be similar to anchoring pin 145 or some other anchoring pin, may be positioned within the hole 520. The socket 515 may be communicatively and/or electrically coupled with a board 540 (which may be similar to board 140 or some other board herein) via BGA solder joints 535 (which may be similar to BGA solder joints 135 or some other BGA solder joints herein).

The anchoring pin 545 may be coupled with the board 540 via a solder connection 550 such as that described above with respect to a pin-in-paste or pin-in-hole SMT connection. In embodiments, the solder connection 550 may be made of a same or different solder material than the solder material used for BGA solder joints 535. In some embodiments, the solder connection 550 may be with an electrically and communicatively active or neutral portion of the board 540.

Figure 6:
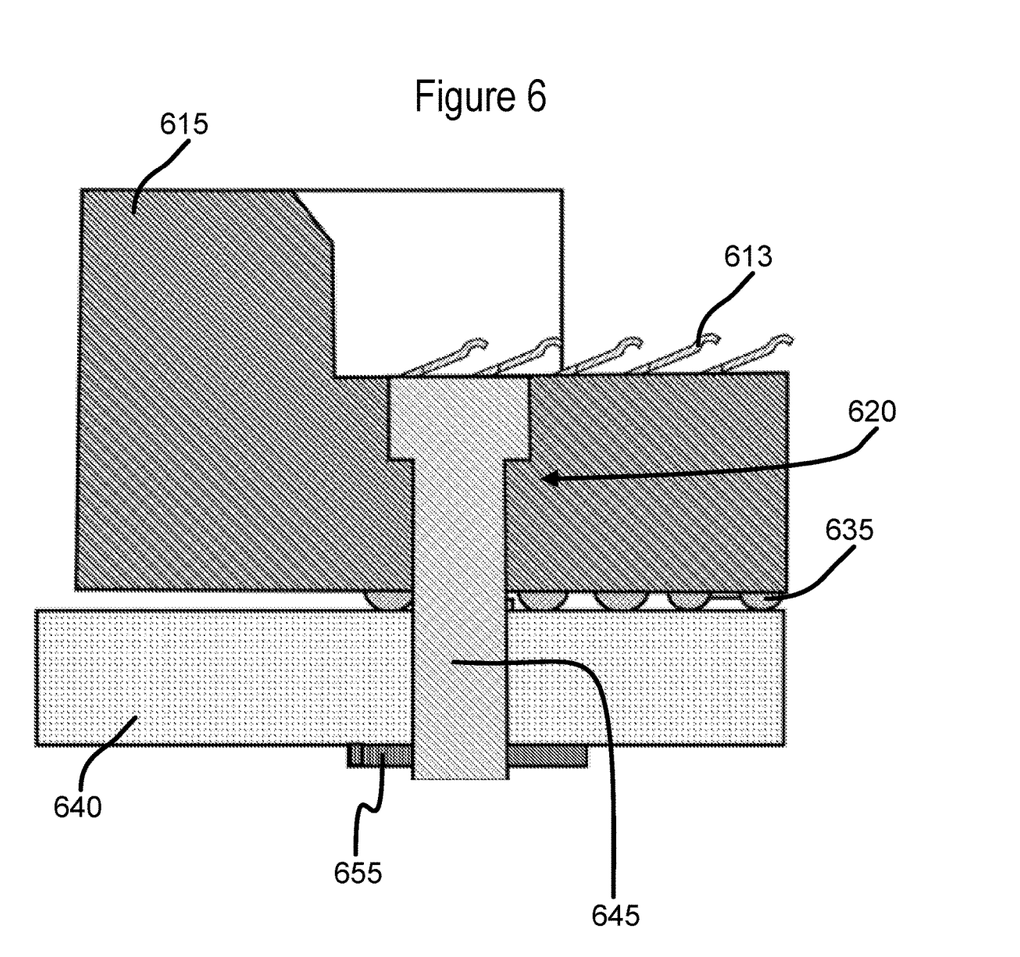
FIG. 6 depicts an alternative example of an implementation of an anchoring pin, in accordance with various embodiments.

FIG. 6 depicts an alternative example of an implementation of an anchoring pin 645 coupled with a board 640 via one of the techniques described above. Specifically, FIG. 6 depicts a socket 615, one or more j-leads 613, hole 620, anchoring pin 645, one or more BGA solder joints 635, and board 640, which may be respectively similar to socket 515, one or more j-leads 513, hole 520, anchoring pin 545, one or more BGA solder joints 535, and board 540.

As shown in FIG. 6, anchoring pin 645 may extend through the entirety of the board 640. The anchoring pin 645 may be secured in place via a nut 655 attached with the anchoring pin 645 at a side of the board 640 opposite the side to which the one or more BGA solder joints 635 are coupled. As described above, in other embodiments the anchoring pin 645 may be soldered to the board 640 via THM wave soldering or via some other process or technique.

Figure 7:
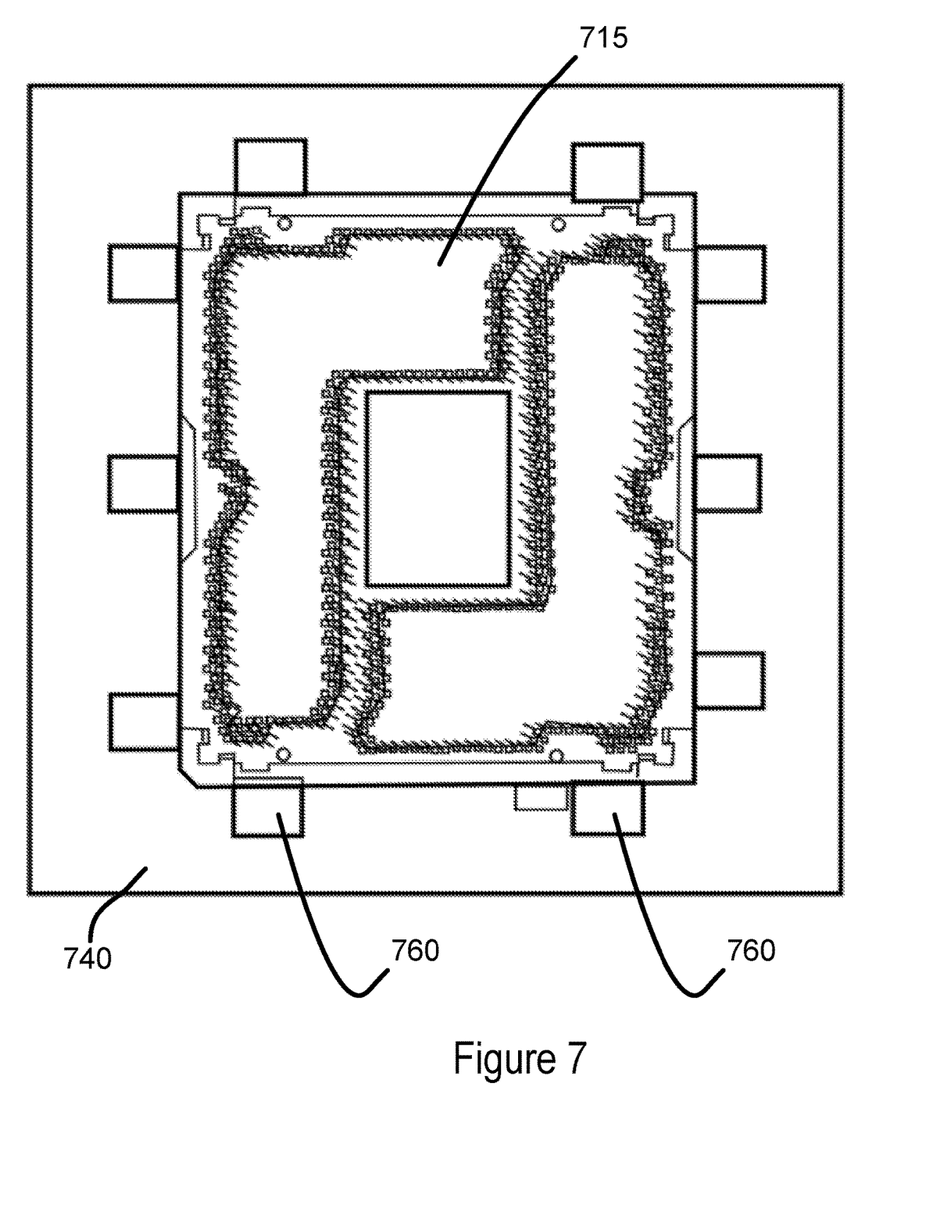
FIG. 7 depicts an example of a socket that may use one or more anchoring pins, in accordance with various embodiments.

FIG. 7 depicts an example of a socket 715, which may be similar to socket 115 or some other socket herein, that may use one or more anchoring pins (not shown for clarity) to attach to a board 740 (which may be similar to board 140 or some other board herein). In embodiments, the socket 715 may include one or more extensions 760. As noted above, the position of the anchoring pins may be based on factors such as load boundary conditions, socket design, and/or some other factors. The extensions 760 may be positioned on the socket 715 based on one or more of the above listed factors. For example, a particular area of the socket 715 may be identified as having a higher than average likelihood of experiencing a failure condition, and so an extension 760 may be positioned at or near that area. The anchoring pins may then attach to one or more of the extensions 760, rather than to the body of the socket 715 itself, and thereby attach the socket 715 to the board 740. By doing so, the socket body may not need to be altered or re-designed, and more CTF pins of the socket 715 may be available.

Figure 8:
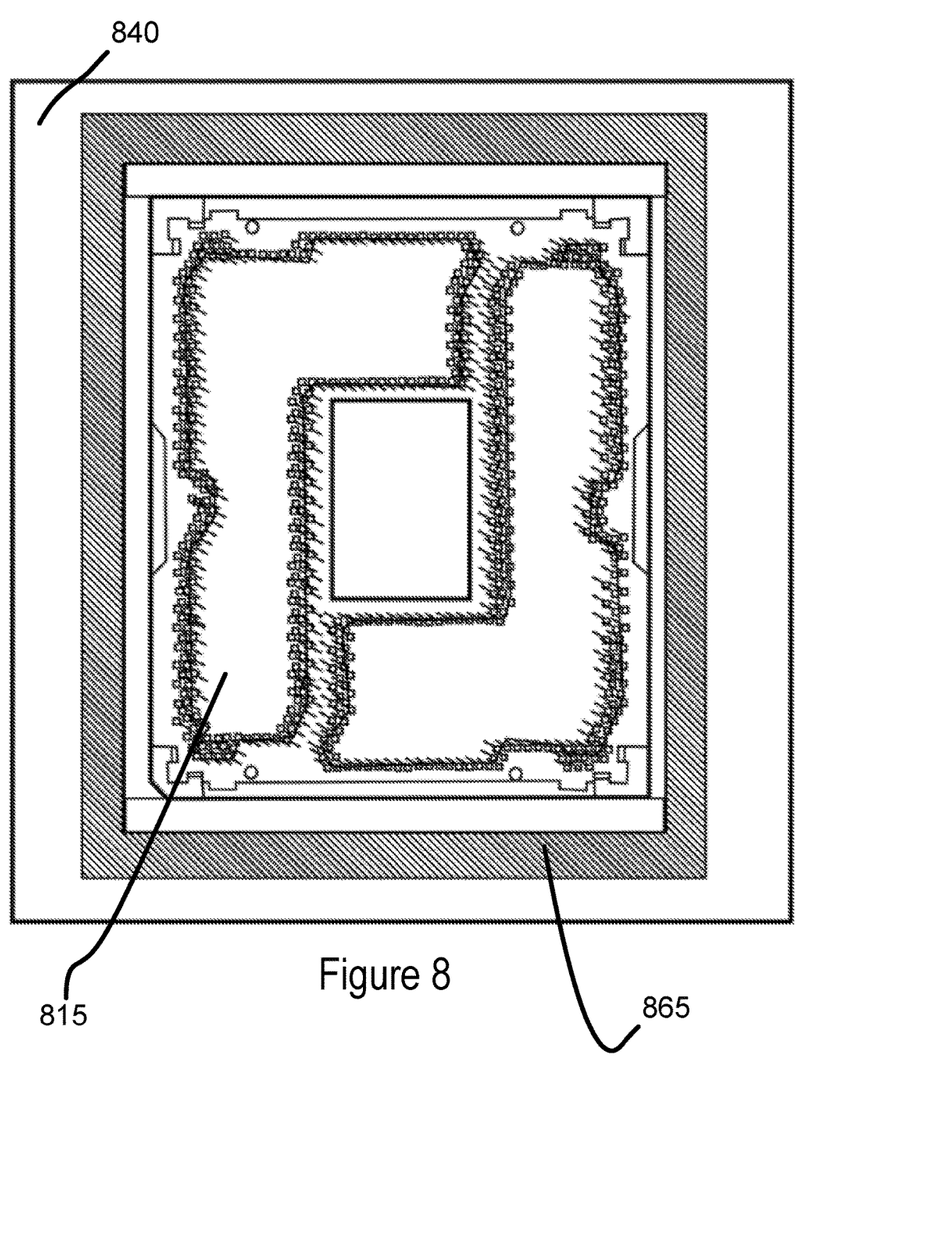
FIG. 8 depicts an example of a socket that is held by a plate that may use one or more anchoring pins, in accordance with various embodiments.

FIG. 8 depicts an alternative example of a socket 815, which may be similar to socket 115 or some other socket herein. In embodiments, socket 815 may have a plate 865, for example, a metal plate, positioned around the periphery of socket 815. Anchoring pins (not shown for clarity) may be coupled with the plate 865 and anchored to the board 840. In this way, the plate 865 may hold the socket 815 in place against the board 840.

Although FIGS. 4a through 8, above, are generally depicted with reference to a socket, it will be understood that in other embodiments the depicted anchoring pins may be directly coupled with a die package, a socket, and/or a stiffener.

Figure 9:
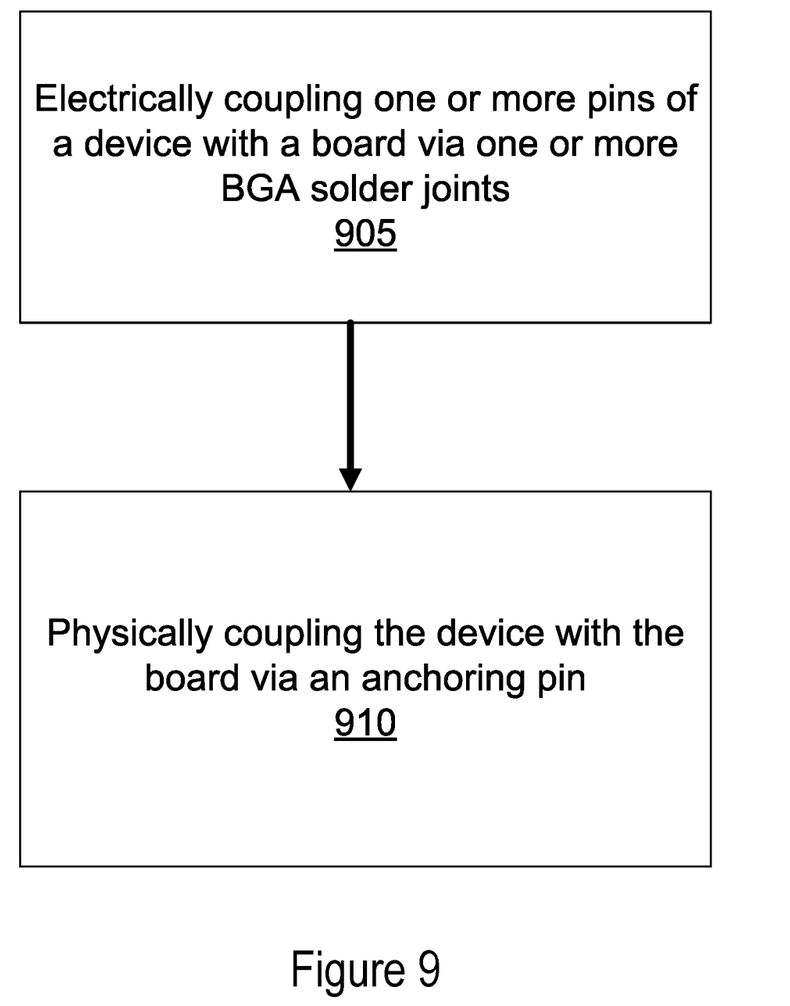
FIG. 9 depicts an example process by which a device may be coupled with a board via one or more anchoring pins, in accordance with various embodiments.

FIG. 9 depicts an example process by which a device such as socket 115 (or some other device such as a die package and/or stiffener) may be coupled with a board such as board 140 via one or more anchoring pins. Specifically, the process may include electrically coupling one or more pins of a device, for example, CTF pins of socket 115, with a board such as board 140 via one or more BGA solder joints such as BGA solder joints 135 at 905.

The process may then include physically coupling the device with the board via an anchoring pin such as anchoring pin 145 at 910. As described above, the anchoring pin may be formed of a different material and/or may have a different shape than the one or more BGA solder joints.

Figure 10:
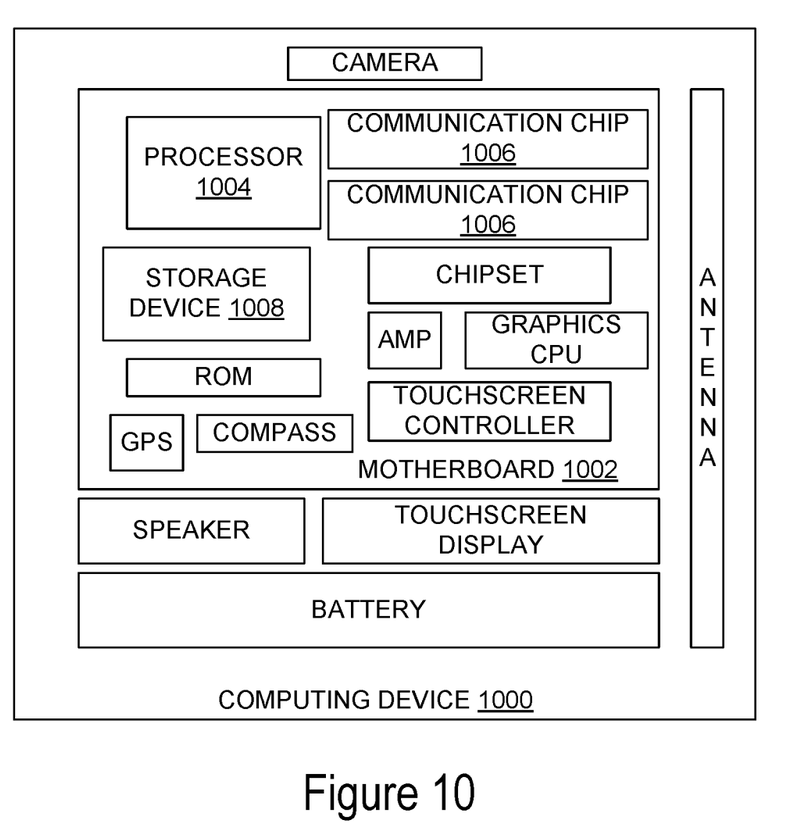
FIG. 10 is an example computing device that may include one or more anchoring pins, in accordance with various embodiments.

Embodiments of the present disclosure may be implemented into a system using any packages that may benefit from the various manufacturing techniques disclosed herein. FIG. 10 schematically illustrates a computing device 1000, in accordance with some implementations, which may include one or more electronic device such as electronic device 100, 200, 300, etc. For example, various elements such as processor 1004, communication chip 1006, and/or some other component of the computing device 1000 may be implemented as one of packages 105, 205, 305, etc. The board 140, 240, 340, etc. may be implemented as motherboard 1002. One or more of the components of the computing device 1000 may be coupled with the motherboard 1002 via one or more anchoring pins as described above.

The computing device 1000 may be, for example, a mobile communication device or a desktop or rack-based computing device. The computing device 1000 may house a board such as a motherboard 1002. The motherboard 1002 may include a number of components, including (but not limited to) a processor 1004 and at least one communication chip 1006. Any of the components discussed herein with reference to the computing device 1000 may be arranged in or coupled with a package such as discussed herein. In further implementations, the communication chip 1006 may be part of the processor 1004.

The computing device 1000 may include a storage device 1008. In some embodiments, the storage device 1008 may include one or more solid state drives. Examples of storage devices that may be included in the storage device 1008 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 1000 may include other components that may or may not be physically and electrically coupled to the motherboard 1002. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 1006 and the antenna may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth, and a second communication chip 1006 may be dedicated to longer range wireless communications such as GPS, EDGE, GPRS, CDMA, WiMAX, LTE, EV-DO, and others. In some embodiments, the communication chip 1006 may support wired communications. For example, the computing device 1000 may include one or more wired servers.

The processor 1004 and/or the communication chip 1006 of the computing device 1000 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data. In some embodiments, the recessed conductive contacts disclosed herein may be implemented in a high-performance computing device.

The following paragraphs provide examples of various ones of the embodiments disclosed herein.

Example 1 may include an electronic device comprising: a board; a device physically coupled with the board by an anchoring pin; and a plurality of ball grid array (BGA) solder joints coupled with the device, wherein the BGA solder joints electrically and communicatively couple one or more pins of the device with the board, wherein the BGA solder joints have a shape that is different than the anchoring pin.

Example 2 may include the electronic device of example 1, wherein the anchoring pin is directly coupled with a stiffener coupled with the device and positioned between the device and the plurality of BGA solder joints.

Example 3 may include the electronic device of example 2, further comprising one or more standoffs positioned between the stiffener and the board.

Example 4 may include the electronic device of example 1, wherein the device is a socket.

Example 5 may include the electronic device of example 1, wherein the device is a die package.

Example 6 may include the electronic device of example 1, wherein the anchoring pin is directly coupled with a plate at a perimeter of the device.

Example 7 may include the electronic device of any of examples 1-6, wherein the anchoring pin is generally cylindrical and has a diameter of approximately 2 millimeters (mm).

Example 8 may include the electronic device of any of examples 1-6, wherein the anchoring pin is stainless steel.

Example 9 may include the electronic device of any of examples 1-6, wherein the anchoring pin carries ground signals to or from the board.

Example 10 may include the electronic device of any of examples 1-6, wherein the anchoring pin extends through the board.

Example 11 may include the electronic device of any of examples 1-6, wherein the anchoring pin is coupled with a surface of the board.

Example 12 may include the electronic device of example 11, wherein the surface of the board is opposite a surface to which the plurality of BGA solder joints are coupled.

Example 13 may include a method comprising: electrically coupling one or more pins of a device with a board via one or more ball grid array (BGA) solder joints; and physically coupling the device with the board via an anchoring pin that has a shape and a material composition that is different than a shape and a material composition of the one or more BGA solder joints.

Example 14 may include the method of example 13, wherein the device is a die package.

Example 15 may include the method of example 13, wherein the device is a socket and further comprising coupling a die package with the socket subsequent to physically coupling the socket with the board via the anchoring pin.

Example 16 may include the method of example 13, wherein the device is a stiffener of a socket.

Example 17 may include the method of any of examples 13-16, wherein the anchoring pin is generally cylindrical and has a diameter of approximately 2 millimeters (mm).

Example 18 may include the method of any of examples 13-16, wherein the anchoring pin is stainless steel.

Example 19 may include the method of any of examples 13-16, further comprising coupling the anchoring pin with a same surface of the board as a surface to which the one or more BGA solder joints are coupled.

Example 20 may include the method of any of examples 13-16, wherein the substrate has a first surface and a second surface opposite the first surface, and further comprising: coupling the one or more BGA solder joints with the first surface; and coupling the anchoring pin with the second surface.

What is claimed is:

1. An electronic device comprising:
   a board;
   a device physically coupled with the board by an anchoring pin that extends through the board, the anchoring pin to carry ground signals to or from the board; and
   a plurality of ball grid array (BGA) solder joints coupled with the device, wherein the BGA solder joints electrically and communicatively couple one or more pins of the device with the board, wherein the BGA solder joints have a shape that is different than the anchoring pin.

2. The electronic device of claim 1, wherein the anchoring pin is directly coupled with a stiffener coupled with the device and positioned between the device and the plurality of BGA solder joints.

3. The electronic device of claim 2, further comprising one or more standoffs positioned between the stiffener and the board.

4. An electronic device comprising:
   a board;
   a device physically coupled with the board by an anchoring pin, the anchoring pin to carry ground signals to or from the board; and
   a plurality of ball grid array (BGA) solder joints coupled with the device, wherein the BGA solder joints electrically and communicatively couple one or more pins of the device with the board, wherein the BGA solder joints have a shape that is different than the anchoring pin, and wherein the anchoring pin is coupled with a surface of the board.

5. The electronic device of claim 1, wherein the device is a die package.

6. The electronic device of claim 1, wherein the anchoring pin is directly coupled with a plate at a perimeter of the device.

7. The electronic device of claim 1, wherein the anchoring pin is generally cylindrical and has a diameter of approximately 2 millimeters (mm).

8. The electronic device of claim 1, wherein the anchoring pin is stainless steel.

9. The electronic device of claim 1, wherein the anchoring pin carries ground signals to or from the board.

10. The electronic device of claim 1, wherein the anchoring pin is coupled with a surface of the board and the surface of the board is opposite a surface to which the plurality of BGA solder joints are coupled.

11. A method comprising:
    electrically coupling one or more pins of a device with a board via one or more ball grid array (BGA) solder joints; and
    physically coupling the device with the board via an anchoring pin that has a shape and a material composition that is different than a shape and a material composition of the one or more BGA solder joints, the anchoring pin to carry ground signals to or from the board.

12. The method of claim 11, further comprising coupling a die package with a socket subsequent to physically coupling the device with the board via the anchoring pin.

13. The method of claim 11, wherein the anchoring pin is generally cylindrical and has a diameter of approximately 2 millimeters (mm).

14. The method of claim 11, wherein the anchoring pin is stainless steel.

15. The method of claim 11, further comprising coupling the anchoring pin with a same surface of the board as a surface to which the one or more BGA solder joints are coupled.

16. The method of claim 11, wherein the substrate has a first surface and a second surface opposite the first surface, and further comprising:
    coupling the one or more BGA solder joints with the first surface; and
    coupling the anchoring pin with the second surface.

17. An electronic device comprising:
    a board;
    a device physically coupled with the board by an anchoring pin, wherein the anchoring pin is directly coupled with a plate at a perimeter of the device, the anchoring pin to carry ground signals to or from the board; and
    a plurality of ball grid array (BGA) solder joints coupled with the device, wherein the BGA solder joints electrically and communicatively couple one or more pins of the device with the board, wherein the BGA solder joints have a shape that is different than the anchoring pin.

18. The electronic device of claim 17, wherein the device is a die package.

19. The electronic device of claim 17, wherein the anchoring pin extends through the board.

20. The electronic device of claim 17, wherein the anchoring pin is coupled with a surface of the board.

21. The electronic device of claim 20, wherein the surface of the board is opposite a surface to which the plurality of BGA solder joints are coupled.

* * * * *